US012813181B2

(12) United States Patent
Mukaiyama et al.

(10) Patent No.: US 12,813,181 B2
(45) Date of Patent: Nov. 24, 2026

(54) PLASMA PROCESSING METHOD AND PLASMA PROCESSING SYSTEM

(71) Applicant: Tokyo Electron Limited, Tokyo (JP)

(72) Inventors: Koki Mukaiyama, Miyagi (JP); Maju Tomura, Miyagi (JP); Yoshihide Kihara, Miyagi (JP); Atsushi Takahashi, Miyagi (JP); Takatoshi Orui, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 302 days.

(21) Appl. No.: 18/125,206

(22) Filed: Mar. 23, 2023

(65) Prior Publication Data

US 2023/0307245 A1 Sep. 28, 2023

(30) Foreign Application Priority Data

Mar. 24, 2022 (JP) ................................ 2022-048736
Dec. 20, 2022 (JP) ................................ 2022-202997

(51) Int. Cl.
*H10P 50/28* (2026.01)
*H01J 37/32* (2006.01)
*H10P 50/00* (2026.01)
*H10P 50/24* (2026.01)

(52) U.S. Cl.
CPC ...... *H10P 50/283* (2026.01); *H01J 37/32449* (2013.01); *H10P 50/242* (2026.01); *H10P 50/73* (2026.01); *H01J 2237/334* (2013.01)

(58) Field of Classification Search
None
See application file for complete search history.

(56) References Cited

U.S. PATENT DOCUMENTS 6,136,214 A * 10/2000 Mori ................. H01J 37/32871 257/E21.252
9,673,058 B1 * 6/2017 Briggs .............. H01L 21/31116
2019/0074191 A1 * 3/2019 Nagatomo ........ H01L 21/31116
2021/0005472 A1 * 1/2021 Kanarik ............ H01L 21/67109
2021/0057228 A1 * 2/2021 Yamada .............. H01L 21/3065

FOREIGN PATENT DOCUMENTS

CN 113594032 A 11/2021
CN 114078683 A 2/2022
JP 2016-039310 A 3/2016

(Continued)

*Primary Examiner* — Stephanie P Duclair
(74) *Attorney, Agent, or Firm* — XSENSUS LLP

(57) ABSTRACT

A plasma processing method executed by a plasma processing apparatus having a chamber is provided. The method includes: (a) providing a substrate having a silicon containing film and a mask on the silicon containing film; and (b) etching the silicon containing film, the (b) including (b-1) etching the silicon containing film by using a plasma generated from a first processing gas containing a hydrogen fluoride gas and a tungsten containing gas, and (b-2) etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

20 Claims, 12 Drawing Sheets

(56) References Cited

FOREIGN PATENT DOCUMENTS

| | | | |
|---|---|---|---|
| JP | 2019-046994 | A | 3/2019 |
| KR | 2017-0106927 | A | 9/2017 |
| KR | 2021-0036992 | A | 4/2021 |
| KR | 2021-0134224 | A | 11/2021 |
| TW | 201436032 | A | 9/2014 |
| TW | 201913802 | A | 4/2019 |
| TW | 202129697 | A | 8/2021 |

* cited by examiner

PLASMA PROCESSING METHOD AND PLASMA PROCESSING SYSTEM

CROSS-REFERENCE TO RELATED APPLICATIONS

This application is based on and claims priority from Japanese Patent Application Nos. 2022-048736 and 2022-202997 filed on Mar. 24, 2022 and Dec. 20, 2022, respectively, with the Japan Patent Office, the disclosures of which are incorporated herein in their entireties by reference.

TECHNICAL FIELD

Exemplary embodiments of the present disclosure relate to a plasma processing method and a plasma processing system.

BACKGROUND

Japanese Patent Laid-Open Publication No. 2016-039310 discloses a technique of etching a multilayer film in which a silicon oxide film and a silicon nitride film are alternately stacked.

SUMMARY

In one exemplary embodiment of the present disclosure, there is provided a plasma processing method executed by a plasma processing apparatus having a chamber, the plasma processing method including:

(a) providing a substrate having a silicon containing film and a mask on the silicon containing film; and (b) etching the silicon containing film, the (b) including (b-1) etching the silicon containing film by using a plasma generated from a first processing gas containing a hydrogen fluoride gas and a tungsten containing gas, and (b-2) etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
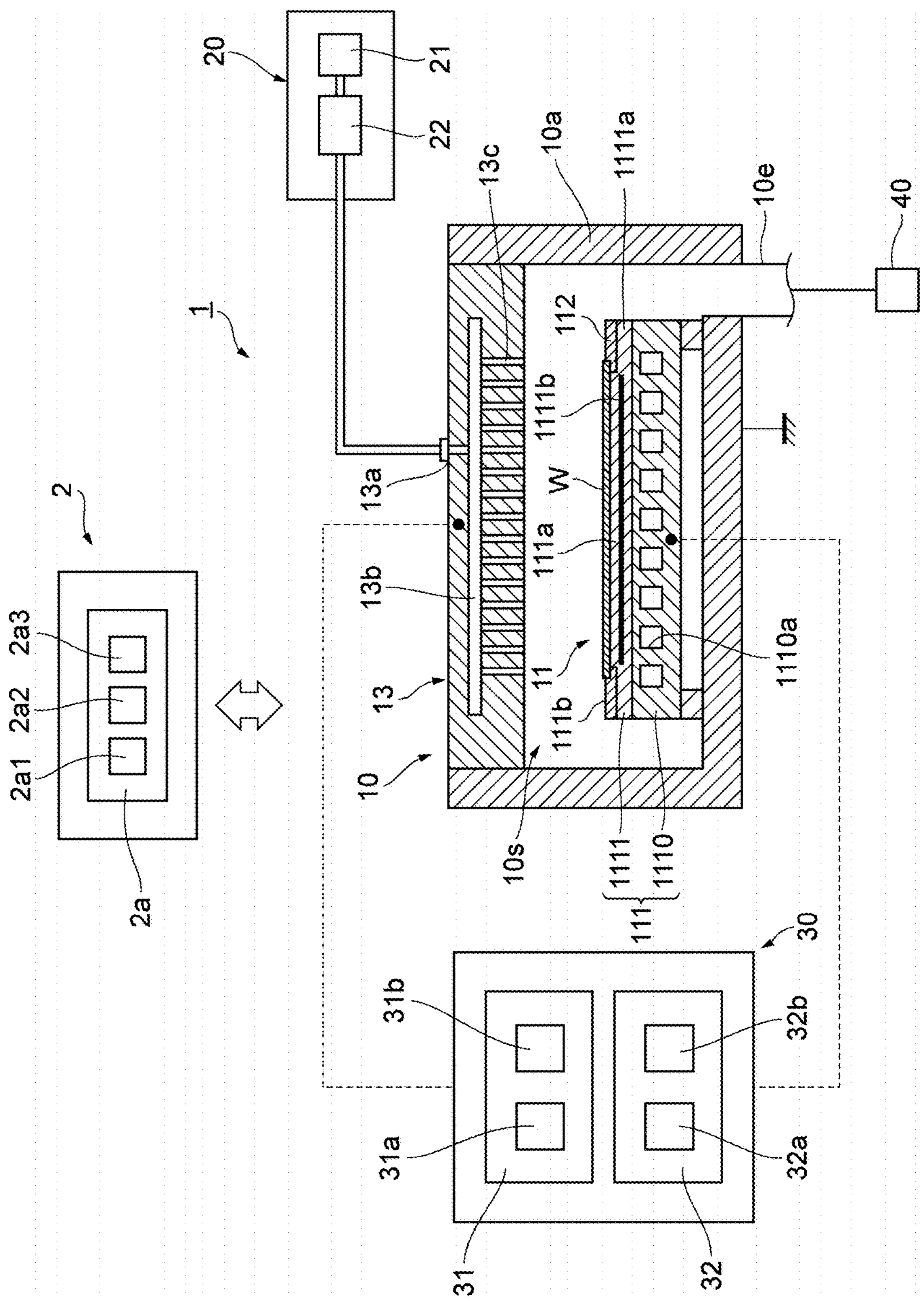
FIG. 1 is a diagram schematically illustrating an exemplary plasma processing system.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described.

In one exemplary embodiment, there is provided a plasma processing method executed by a plasma processing apparatus having a chamber, the plasma processing method including: (a) providing a substrate having a silicon containing film and a mask on the silicon containing film; and (b) etching the silicon containing film, the (b) including (b-1) etching the silicon containing film by using a plasma generated from a first processing gas containing a hydrogen fluoride gas and a tungsten containing gas, and (b-2) etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

In one exemplary embodiment, in the (b), the (b-1) and the (b-2) are alternately repeated.

In one exemplary embodiment, in the (b), a cycle including the (b-1) and the (b-2) is repeated a plurality of times, and in the (b-1) of at least one cycle after a second cycle, the flow ratio of the tungsten containing gas to the first processing gas is smaller than the flow ratio in the (b-1) of a first cycle.

In one exemplary embodiment, at least one selected from a group consisting of the tungsten containing gas contained in the first processing gas and the tungsten containing gas contained in the second processing gas is a $WF_aCl_b$ (a and b are each an integer of 0 or more and 6 or less, and a sum of a and b is 2 or more and 6 or less) gas.

In one exemplary embodiment, at least one selected from a group consisting of the tungsten containing gas contained in the first processing gas and the tungsten containing gas contained in the second processing gas is at least one gas selected from a group consisting of a $WF_6$ gas and a $WCl_6$ gas.

In one exemplary embodiment, in the first processing gas, a flow rate of the hydrogen fluoride gas is a largest among all gases excluding an inert gas.

In one exemplary embodiment, in the first processing gas, a flow rate of the tungsten containing gas is a smallest among all gases excluding an inert gas.

In one exemplary embodiment, in the first processing gas, a flow rate of the hydrogen fluoride gas is 10 times or more than a flow rate of the tungsten containing gas.

In one exemplary embodiment, at least one selected from a group consisting of the first processing gas and the second processing gas further contains a phosphorus containing gas.

In one exemplary embodiment, the phosphorus containing gas is a halogenated phosphorus gas.

In one exemplary embodiment, at least one selected from a group consisting of the first processing gas and the second processing gas further contains a carbon containing gas.

In one exemplary embodiment, the carbon containing gas is either a fluorocarbon gas or a hydrofluorocarbon gas.

In one exemplary embodiment, at least one selected from a group consisting of the first processing gas and the second processing gas further contains an oxygen containing gas.

In one exemplary embodiment, at least one selected from a group consisting of the first processing gas and the second processing gas further contains a gas containing halogen other than fluorine.

In one exemplary embodiment, the mask has a hole pattern or a slit pattern.

In one exemplary embodiment, there is provided a plasma processing method executed by a plasma processing apparatus having a chamber, the plasma processing method including: (a) providing a substrate having a silicon containing film and a mask on the silicon containing film; and (b) etching the silicon containing film, the (b) including (b-1) etching the silicon containing film by using a first plasma containing a hydrogen fluoride species and a chemical species containing at least one selected from a group consisting of tungsten, titanium and molybdenum, and (b-2) etching the silicon containing film by using a second plasma containing a hydrogen fluoride species, the second plasma not containing the chemical species, or containing the chemical species at a partial pressure lower than a partial pressure of the chemical species in the first plasma.

In one exemplary embodiment, the hydrogen fluoride species is generated from at least one gas selected from a group consisting of a hydrogen fluoride gas and a hydrofluorocarbon gas.

In one exemplary embodiment, the hydrogen fluoride species is generated from a hydrofluorocarbon gas having 2 or more carbon atoms.

In one exemplary embodiment, the hydrogen fluoride species is generated from a fluorine containing gas and a hydrogen containing gas.

In one exemplary embodiment, there is provided a plasma processing system including: a chamber; a substrate support provided inside the chamber; a plasma generator; and a controller configured to execute (a) control of providing a substrate having a silicon containing film and a mask on the silicon containing film onto the substrate support, and (b) control of etching the silicon containing film, the (b) control including (b-1) control etching the silicon containing film by using a plasma generated from a first processing gas containing a hydrogen fluoride gas and a tungsten containing gas, and (b-2) control etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

Hereinafter, each embodiment of the present disclosure will be described in detail with reference to the drawings. In the drawings, the same or similar elements are denoted by the same reference numerals, and overlapping descriptions thereof will be omitted. Unless otherwise specified, a positional relationship of up/down, left/right, or the like will be described based on a positional relationship illustrated in the drawings. The dimensional ratios in the drawings do not indicate actual ratios, and the actual ratios are not limited to the illustrated ratios.

Configuration Example of Plasma Processing System

Hereinafter, an example of the configuration example of a plasma processing system will be described. FIG. 1 is a view for explaining an example of a configuration of a capacitively-coupled plasma processing apparatus.

The plasma processing system includes a capacitively-coupled plasma processing apparatus 1 and a controller 2. The capacitively-coupled plasma processing apparatus 1 includes a plasma processing chamber 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 has at least one gas supply port for supplying at least one processing gas into the plasma processing space 10*s*, and at least one gas exhaust port for exhausting the gas from the plasma processing space 10*s*. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central region 111*a* for supporting a substrate W and an annular region 111*b* for supporting the ring assembly 112. A wafer is an example of the substrate W. The annular region 111*b* of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. Accordingly, the central region 111*a* is also referred to as a substrate support surface for supporting the substrate W, and the annular region 111*b* is also referred to as a ring support surface for supporting the edge ring assembly 112.

In one embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has the central region 111*a*. In one embodiment, the ceramic member 1111*a* also has the annular region 111*b*. Other members that surround the electrostatic chuck 1111, such as an annular electrostatic chuck and an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, an RF or DC electrode may be disposed in the ceramic member 1111a, and in this case, the RF or DC electrode functions as a lower electrode. In a case where a bias RF signal or DC signal, which will be described later, is connected to the RF or DC electrode, the RF or DC electrode is also referred to as a bias electrode. Both the conductive member of the base 1110 and the RF or DC electrode may function as two lower electrodes.

The ring assembly 112 includes one or more annular members. In one embodiment, one or more annular members include one or more edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, a flow path 1110a, or a combination thereof. A heat transfer fluid, such as brine or gas, flows through the flow path 1110a. In one embodiment, the flow path 1110a is formed inside the base 1110, and one or more heaters are disposed in the ceramic member 1111a of the electrostatic chuck 1111. Further, the substrate support 11 may include a heat transfer gas supply configured to supply a heat transfer gas to a gap between a rear surface of the substrate W and the central region 111a.

The shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes an upper electrode. The gas introduction unit may include, in addition to the shower head 13, one or a plurality of side gas injectors (SGI) that are attached to one or a plurality of openings formed in the sidewall 10a.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to the plasma processing chamber 10 via at least one impedance matching circuit. The RF power source 31 is configured to supply at least one RF signal (RF power), such as a source RF signal and a bias RF signal, to at least one lower electrode and/or at least one upper electrode. Accordingly, a plasma is formed from at least one processing gas supplied into the plasma processing space 10s. Accordingly, the RF power source 31 may function as at least a portion of a plasma generator configured to generate plasma from one or more processing gases in the plasma processing chamber 10. Further, supplying the bias RF signal to at least one lower electrode can generate a bias potential in the substrate W to attract an ionic component in the formed plasma to the substrate W.

In one embodiment, the RF power source 31 includes a first RF generator 31a and a second RF generator 31b. The first RF generator 31a is configured to be coupled to at least one lower electrode and/or at least one upper electrode via at least one impedance matching circuit to generate a source RF signal (source RF power) for plasma generation. In one embodiment, the source RF signal has a frequency in the range of 10 MHz to 150 MHz. In one embodiment, the first RF generator 31a may be configured to generate a plurality of source RF signals having different frequencies. The generated one or more source RF signals are supplied to at least one lower electrode and/or at least one upper electrode.

The second RF generator 31b is configured to be coupled to at least one lower electrode via at least one impedance matching circuit to generate the bias RF signal (bias RF power). A frequency of the bias RF signal may be the same as or different from a frequency of the source RF signal. In one embodiment, the bias RF signal has a lower frequency than the frequency of the source RF signal. In one embodiment, the bias RF signal has a frequency in the range of 100 kHz to 60 MHz. In one embodiment, the second RF generator 31b may be configured to generate a plurality of bias RF signals having different frequencies. The generated one or more bias RF signals are supplied to at least one lower electrode. In addition, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is configured to be connected to at least one lower electrode to generate the first DC signal. The generated first bias DC signal is applied to at least one lower electrode. In one embodiment, the second DC generator 32b is configured to be connected to at least one upper electrode to generate a second DC signal. The generated second DC signal is applied to at least one upper electrode.

In various embodiments, at least one of the first and second DC signals may be pulsed. In this case, a sequence of voltage pulses based on DC is applied to at least one lower electrode and/or at least one upper electrode. The voltage pulse may have a pulse waveform of a rectangle, a trapezoid, a triangle, or a combination thereof. In one embodiment, a waveform generator for generating a sequence of voltage pulses from the DC signal is connected between the first DC generator 32a and at least one lower electrode. Accordingly, a voltage pulse generator is configured with the first DC generator 32a and the waveform generator. In a case where the voltage pulse generator is configured with the second DC generator 32b and the waveform generator, the voltage pulse generator is connected to at least one upper electrode. The voltage pulse may have a positive polarity or a negative polarity. Further, the sequence of the voltage pulses may include one or more positive voltage pulses and one or more negative voltage pulses in one cycle. The first and second DC generators 32a and 32b may be provided in addition to the RF power source 31, and the first DC generator 32a may be provided instead of the second RF generator 31b.

The exhaust system 40 may be connected to, for example, a gas exhaust port 10e disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. For example, the computer 2*a* may include a processor (central processing unit (CPU)) 2*a*1, a storage 2*a*2, and a communication interface 2*a*3. The processor 2*a*1 may be configured to read a program from the storage unit 2*a*2 and perform various control operations by executing the read program. The program may be stored in advance in the storage unit 2*a*2, or may be acquired via a medium when necessary. The acquired program is stored in the storage unit 2*a*2, and is read from the storage unit 2*a*2 and executed by the processor 2*a*1. The medium may be various storing media readable by the computer 2*a*, or may be a communication line connected to the communication interface 2*a*3. The storage unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Example of Plasma Processing Method

Figure 2:
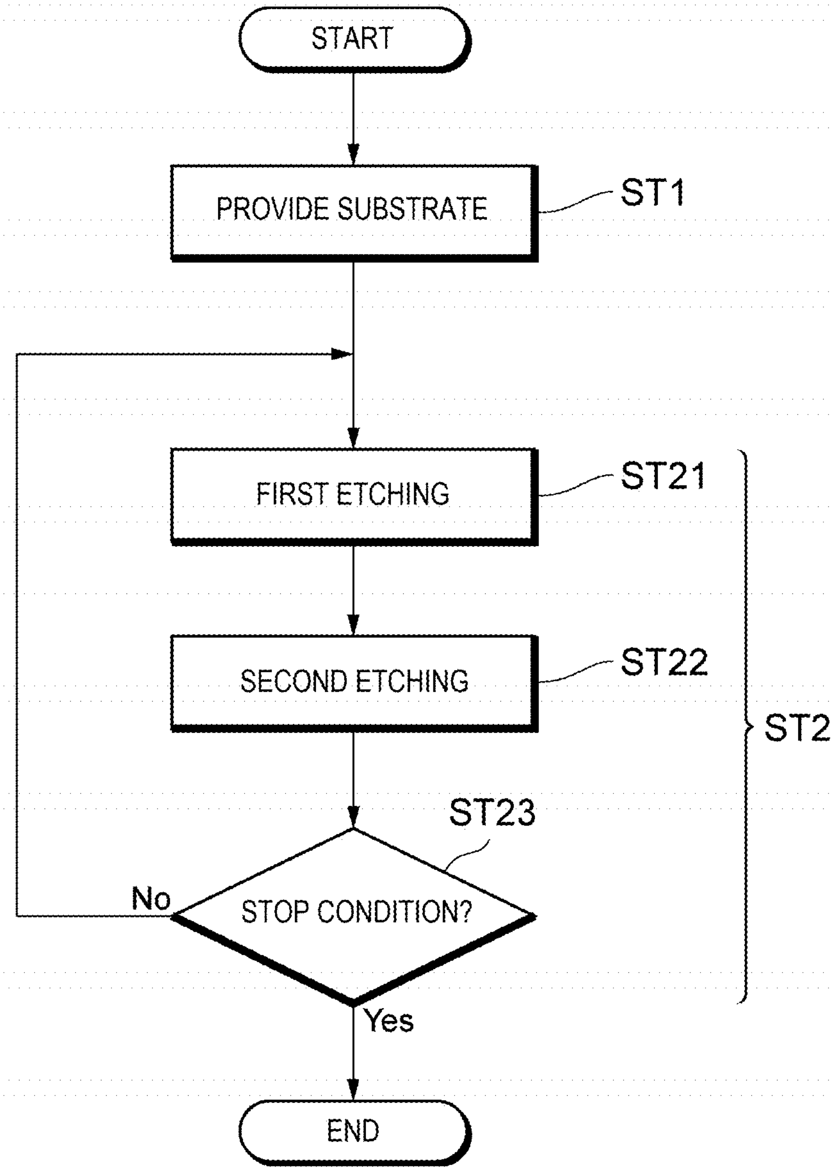
FIG. 2 is a flowchart illustrating an example of the present processing method.

FIG. 2 is a flowchart illustrating a plasma processing method (hereinafter, also referred to as a "present processing method") according to one exemplary embodiment. As illustrated in FIG. 2, the present processing method includes step ST1 of providing a substrate, and step ST2 of performing etching. Processing in each step may be executed by the plasma processing system illustrated in FIG. 1. Hereinafter, a case where the controller 2 controls each part of the plasma processing apparatus 1 to execute the present processing method for the substrate W will be described by way of an example.

Step ST1: Provision of Substrate

In step ST1, the substrate W is provided into the plasma processing space 10*s* of the plasma processing apparatus 1. The substrate W is provided in the central region 111*a* of the substrate support 11. Then, the substrate W is held by the substrate support 11 by the electrostatic chuck 1111.

Figure 3:
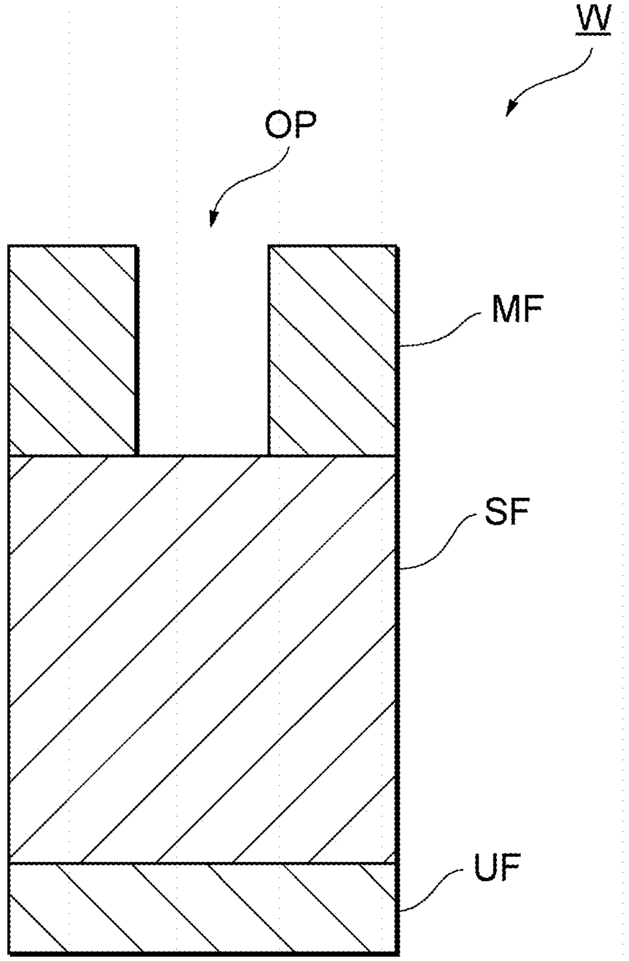
FIG. 3 is a diagram illustrating an example of a cross-sectional structure of a substrate W.

FIG. 3 is a view illustrating an example of a cross-sectional structure of the substrate W provided in step ST1. In the substrate W, a silicon containing film SF and a mask MF are stacked in this order on an underlying film UF. The substrate W may be used for manufacturing a semiconductor device. The semiconductor device includes, for example, a semiconductor memory device, such as a DRAM or a 3D-NAND flash memory.

The underlying film UF is, in an example, a silicon wafer, or an organic film, a dielectric film, a metal film, a semiconductor film, or the like formed on the silicon wafer. The underlying film UF may be configured by stacking a plurality of films.

The silicon containing film SF is a film that is a target of etching in the present processing method. The silicon containing film SF is, in an example, a silicon oxide film, a silicon nitride film, a silicon oxynitride film, or a polycrystalline silicon film. The silicon containing film SF may be configured by stacking a plurality of films. The silicon containing film SF may be configured by stacking at least two types of films selected from the group consisting of a silicon oxide film, a silicon nitride film, and a polycrystalline silicon film. For example, the silicon containing film SF may be configured by alternately stacking a silicon oxide film and a silicon nitride film. Further, for example, the silicon containing film SF may be configured by alternately stacking a silicon oxide film and a polycrystalline silicon film.

The mask MF is a film that functions as a mask in the etching of the silicon containing film SF. The mask MF may be, for example, a polysilicon film, a boron-doped silicon film, a tungsten containing film (for example, a WC film, a WSi film, or the like), a carbon containing film (for example, an amorphous carbon film, a spin-on carbon film, a photoresist film), or a tin oxide film or a titanium containing film (for example, a TiN film or the like).

As illustrated in FIG. 3, the mask MF defines at least one opening OP on the silicon containing film SF. The opening OP is a space on the silicon containing film SF and is surrounded by a sidewall of the mask MF. That is, an upper surface of the silicon containing film SF has a region covered with the mask MF and a region exposed at the bottom of the opening OP.

The opening OP may have any shape in a plan view of the substrate W, that is, when the substrate W is viewed in a direction from the top to the bottom in FIG. 3. The shape may be, for example, a circle, an ellipse, a rectangle, a line, or a shape obtained by combining one or more types thereof. The mask MF may have a plurality of sidewalls, and the plurality of sidewalls may define a plurality of openings OP. The plurality of openings OP may each have a linear shape, and may be arranged at regular intervals to form a line and space pattern. Further, the plurality of openings OP may each have a hole shape and may form an array pattern.

Each film (the underlying film UF, the silicon containing film SF, and the mask MF) constituting the substrate W may be formed by a CVD method, an ALD method, a spin coating method, or the like. The opening OP may be formed by etching the mask MF. Further, the mask MF may be formed by lithography. Each of the above-described films may be a flat film or a film having unevenness. Further, the substrate W may further have another film below the underlying film UF, and a stacked film of the silicon containing film SF and the underlying film UF may function as a multilayer mask. That is, the other film may be etched using the stacked film of the silicon containing film SF and the underlying film UF as the multilayer mask.

At least some of the processes of forming respective films of the substrate W may be performed in a space of the plasma processing chamber 10. In an example, a step of etching the mask MF to form the opening OP may be executed in the plasma processing chamber 10. That is, the etching of the opening OP and the silicon containing film SF, which will be described later, may be consecutively executed in the same chamber. Further, the substrate may be provided by forming all or some of the respective films of the substrate W with an apparatus or a chamber outside the plasma processing apparatus 1, and then carrying the substrate W into the plasma processing space 10*s* of the plasma processing apparatus 1 and disposing the substrate W on the central region 111*a* of the substrate support 11.

After the substrate W is provided to the central region 111*a* of the substrate support 11, the temperature of the substrate support 11 is adjusted to a set temperature by the temperature control module. The set temperature may be, for example, 70° C. or lower, 0° C. or lower, −10° C. or lower, −20° C. or lower, −30° C. or lower, −40° C. or lower, −50° C. or lower, −60° C. or lower, or −70° C. or lower. In an example, adjusting or maintaining the temperature of the substrate support 11 includes adjusting or maintaining the temperature of the heat transfer fluid flowing through the flow path 1110*a* to the set temperature or a temperature different from the set temperature. In an example, adjusting or maintaining the temperature of the substrate support 11 includes controlling the pressure of a heat transfer gas (for example, He) between the electrostatic chuck 1111 and the rear surface of the substrate W. The time at which the heat transfer fluid starts to flow through the flow path 1110*a* may be before or after the substrate W is placed on the substrate support 11, or may be at the same time. Further, in the present processing method, the temperature of the substrate support 11 may be adjusted to the set temperature before step ST1. That is, after the temperature of the substrate support 11 is adjusted to the set temperature, the substrate W may be provided to the substrate support 11.

(Step ST2: Etching)

In step ST2, the silicon containing film SF of the substrate W is etched. Step ST2 includes a first etching step ST21 and a second etching step ST22. In addition, step ST2 may include step ST23 of determining whether an etching stop condition is satisfied. That is, step ST21 and step ST22 may be alternately repeated until determination is made in step ST23 that the stop condition is satisfied. During processing in step ST2, the temperature of the substrate support 11 is maintained at the set temperature adjusted in step ST1.

(Step ST21: First Etching Step)

In step ST21, the silicon containing film SF is etched using the plasma generated from the first processing gas. First, the first processing gas is supplied from the gas supply 20 into the plasma processing space 10*s*. The first processing gas contains a hydrogen fluoride (HF) gas and a tungsten containing gas. Next, the source RF signal is supplied to the lower electrode of the substrate support 11 and/or the upper electrode of the shower head 13. With this, a high-frequency electric field is generated between the shower head 13 and the substrate support 11, and the plasma is generated from the first processing gas in the plasma processing space 10*s*. Further, a bias signal is supplied to the lower electrode of the substrate support 11, and a bias potential is generated between the plasma and the substrate W. Active species, such as ions and radicals in the plasma, are drawn into the substrate W by the bias potential, and the silicon containing film SF is etched by the active species.

(Step ST22: Second Etching Step)

In the second etching step ST22, the silicon containing film SF is etched using the plasma generated from the second processing gas. First, the second processing gas is supplied from the gas supply 20 into the plasma processing space 10*s*. The second processing gas may not contain a tungsten containing gas. Further, the second processing gas may contain a tungsten containing gas. In this case, the flow ratio of the tungsten containing gas in the second processing gas (the flow rate of the tungsten containing gas with respect to the flow rates of all the gases excluding an inert gas) is smaller than the flow ratio of the tungsten containing gas in the first processing gas. That is, the second processing gas may contain a tungsten containing gas at a flow ratio smaller than the flow ratio of the tungsten containing gas in the first processing gas. Next, the source RF signal is supplied to the lower electrode of the substrate support 11 and/or the upper electrode of the shower head 13. With this, a high-frequency electric field is generated between the shower head 13 and the substrate support 11, and the plasma is generated from the second processing gas in the plasma processing space 10*s*. Further, a bias signal is supplied to the lower electrode of the substrate support 11, and a bias potential is generated between the plasma and the substrate W. Active species, such as ions and radicals in the plasma, are drawn into the substrate W by the bias potential, the silicon containing film SF is etched by the active species, and a recess is formed based on the shape of the opening OP of the mask MF.

In step ST21 and step ST22, the bias signal may be the bias RF signal supplied from the second RF generator 31*b*. Further, the bias signal may be the bias DC signal supplied from the first DC generator 32*a*. In the source RF signal and the bias signal, both may be continuous waves or pulsed waves, or one may be continuous waves and the other may be pulsed waves. When both the source RF signal and the bias signal are pulsed waves, the cycles of both the pulsed waves may be synchronized. Further, the duty ratio of the pulsed waves may be appropriately set, and may be, for example, 1% to 80%, or 5% to 50%. The duty ratio is a ratio of a period in which the power or the voltage level is high with respect to the cycle of the pulsed waves. Further, in a case of using the bias DC signal, the pulsed wave may have a waveform of a rectangle, a trapezoid, a triangle, or a combination thereof. The polarity of the bias DC signal may be negative or positive as long as the potential of the substrate W is set such that a potential difference is given between the plasma and the substrate to draw in ions.

(Step ST23: End Determination)

In step ST23, whether a stop condition is satisfied is determined. The stop condition may be, for example, whether the number of repetitions of a cycle including step ST21 and step ST22 as one cycle has reached a given number. The stop condition may be, for example, whether the etching time has reached a given time. The stop condition may be, for example, whether the depth of the recess formed by etching has reached a given depth. When determination is made in step ST23 that the stop condition is not satisfied, the cycle including step ST21 and step ST22 is repeated. When determination is made in step ST23 that the stop condition is satisfied, the present processing method ends.

(Configuration of Processing Gas)

As described above, the first processing gas contains a hydrogen fluoride (HF) gas and a tungsten containing gas. Further, the second processing gas contains a hydrogen fluoride (HF) gas, and does not contain a tungsten containing gas or contains a tungsten containing gas at a flow ratio smaller than the flow ratio of the tungsten containing gas in the first processing gas.

In the first processing gas and/or the second processing gas, the flow rate of the HF gas may be the largest among all the gases excluding the inert gas. In an example, the HF gas may be 50% by volume or more, 60% by volume or more, 70% by volume or more, or 80% by volume or more with respect to the total flow rate excluding the inert gas. Further, in the first processing gas and/or the second processing gas, the flow rate of the hydrogen fluoride gas may be 10 times or more than the flow rate of the tungsten containing gas. As the HF gas, a high-purity gas with, for example, a purity of 99.999% or more may be used.

In a case where the second processing gas contains a tungsten containing gas, the tungsten containing gas may be the same type of gas as or a different gas from the tungsten containing gas contained in the first processing gas. Here, the tungsten containing gas may be a gas containing tungsten and halogen, and, in an example, is a $WF_aCl_b$ gas (a and b are each an integer of 0 or more and 6 or less, and a sum of a and b is 2 or more and 6 or less). Specifically, the tungsten containing gas may be a gas containing tungsten and fluorine, such as a tungsten difluoride ($WF_2$) gas, a tungsten tetrafluoride ($WF_4$) gas, a tungsten pentafluoride ($WF_5$) gas, or a tungsten hexafluoride ($WF_6$) gas, or a gas containing tungsten and chlorine, such as a tungsten dichloride ($WCl_2$) gas, a tungsten tetrachloride ($WCl_4$) gas, a tungsten pentachloride ($WCl_5$) gas, or a tungsten hexachloride ($WCl_6$) gas. Among these, at least one gas selected from a group consisting of a $WF_6$ gas and a $WCl_6$ gas may be used.

In the first processing gas and/or the second processing gas, the flow rate of the tungsten containing gas may be the smallest among all the gases excluding the inert gas. In an example, the flow rate of the tungsten containing gas may be 1% by volume or less, 0.5% by volume or less, 0.3% by volume or less, or 0.2% by volume or less with respect to the total flow rate of the processing gas excluding the inert gas. In an example, the flow rate of the tungsten containing gas may be 0.1% by volume or more with respect to the total flow rate of the processing gas excluding the inert gas.

The first processing gas may contain a titanium containing gas or a molybdenum containing gas instead of or in addition to the tungsten containing gas. In this case, a chemical species of tungsten, or titanium or molybdenum is generated in the plasma generated from the first processing gas. The second processing gas may not contain a gas that generates the chemical species. Further, the second processing gas may contain a gas that generates the chemical species at a partial pressure lower than the partial pressure of the gas in the first processing gas.

The first processing gas and/or the second processing gas may further contain a phosphorus containing gas. In a case where both the first processing gas and the second processing gas contain a phosphorus containing gas, the phosphorus containing gas contained in each gas may be the same type of gas or a different gas.

The phosphorus containing gas is a gas containing a phosphorus containing molecule. The phosphorus containing molecule may be an oxide, such as tetraphosphorus decaoxide ($P_4O_{10}$), tetraphosphorus octoxide ($P_4O_8$), and tetraphosphorus hexaoxide ($P_4O_6$). The tetraphosphorus decaoxide is sometimes called diphosphorus pentoxide ($P_2O_5$). The phosphorus containing molecule may be a halide (phosphorus halide), such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). That is, the phosphorus containing molecule may contain fluorine as a halogen element, such as phosphorus fluoride. Alternatively, the phosphorus containing molecule may contain a halogen element other than fluorine, as the halogen element. The phosphorus containing molecule may be halogenated phosphoryl, such as phosphoryl fluoride ($POF_3$), phosphoryl chloride ($POCl_3$), and phosphoryl bromide ($POBr_3$). The phosphorus containing molecule may be phosphine ($PH_3$), calcium phosphide (such as $Ca_3P_2$), phosphoric acid ($H_3PO_4$), sodium phosphate ($Na_3PO_4$), hexafluorophosphoric acid ($HPF_6$), or the like. The phosphorus containing molecule may be fluorophosphines ($H_gPF_h$). Here, the sum of g and h is 3 or 5. As the fluorophosphine, $HPF_2$ and $H_2PF_3$ are exemplified. The processing gas may contain one or more phosphorus containing molecules among the phosphorus containing molecules described above, as at least one phosphorus containing molecule. For example, the processing gas may contain at least one selected from a group consisting of $PF_3$, $PCl_3$, $PF_5$, $PCl_5$, $POCl_3$, $PH_3$, $PBr_3$, or $PBr_5$ as at least one phosphorus containing molecule. In a case where each phosphorus containing molecule contained in the first processing gas and/or in the second processing gas is a liquid or a solid, each phosphorus containing molecule may be evaporated by heating or the like and supplied into the plasma processing space 10*s*.

The phosphorus containing gas may be a $PCl_aF_b$ (a is an integer of 1 or more, b is an integer of 0 or more, and a+b is an integer of 5 or less) gas, or a $PC_cH_dF_e$ (d and e are each an integer of 1 or more and 5 or less, and c is an integer of 0 or more and 9 or less) gas.

The $PCl_aF_b$ gas may be, for example, at least one gas selected from the group consisting of a $PClF_2$ gas, a $PCl_2F$ gas, and a $PCl_2F_3$ gas.

A $PC_cH_dF_e$ gas may be, for example, at least one gas selected from the group consisting of a $PF_2CH_3$ gas, a $PF(CH_3)_2$ gas, a $PH_2CF_3$ gas, a $PH(CF_3)_2$ gas, a $PCH_3(CF_3)_2$ gas, a $PH_2F$ gas, and a $PF_3(CH_3)_2$ gas.

The phosphorus containing gas may be a $PCl_vF_wC_xH_y$ gas (v, w, x, and y are each an integer of 1 or more). Further, the phosphorus containing gas may be a gas containing phosphorus (P), fluorine (F), and halogen (for example, Cl, Br, or I) other than F (fluorine) in its molecular structure, a gas containing phosphorus (P), fluorine (F), carbon I, and hydrogen (H) in its molecular structure, or a gas containing phosphorus (P), fluorine (F), and hydrogen (H) in its molecular structure.

As the phosphorus containing gas, a phosphine-based gas may be used. Examples of the phosphine-based gas include phosphine ($PH_3$), a compound in which at least one hydrogen atom of phosphine is substituted with an appropriate substituent, and a phosphinic acid derivative.

The substituent for substituting the hydrogen atom of the phosphine is not particularly limited, and examples thereof include a halogen atom such as a fluorine atom or a chlorine atom; an alkyl group such as a methyl group, an ethyl group, or a propyl group; and a hydroxyalkyl group such as a hydroxymethyl group, a hydroxyethyl group, or a hydroxypropyl group, and in an example, examples thereof include a chlorine atom, a methyl group, and a hydroxymethyl group.

Examples of the phosphinic acid derivative include phosphinic acid ($H_3O_2P$), alkylphosphinic acid (PHO(OH)R), and dialkylphosphinic acid ($PO(OH)R_2$).

As the phosphine-based gas, for example, at least one gas selected from the group consisting of a $PCH_3Cl_2$ (dichloro(methyl)phosphine) gas, a $P(CH_3)_2Cl$ (chloro(dimethyl)phosphine) gas, a $P(HOCH_2)Cl_2$ (dichloro(hydroxymethyl)phosphine) gas, a $P(HOCH_2)_2Cl$ (chloro(dihydroxymethyl)phosphine) gas, a $P(HOCH_2)(CH_3)_2$ (dimethyl(hydroxymethyl)phosphine) gas, a $P(HOCH_2)_2(CH_3)$ (methyl(dihydroxymethyl)phosphine) gas, a $P(HOCH_2)_3$ (tris(hydroxymethyl)phosphine) gas, a $H_3O_2P$ (phosphinic acid) gas, a $PHO(OH)(CH_3)$(methyl phosphinic acid) gas, and a $PO(OH)(CH_3)_2$(dimethylphosphinic acid) gas may be used.

The flow rate of the phosphorus containing gas contained in the first processing gas and/or the second processing gas may be 20% by volume or less, 10% by volume or less, and 5% by volume or less with respect to the total flow rate of the processing gas containing the phosphorus containing gas except for the inert gas.

The first processing gas and/or the second processing gas may further contain a carbon containing gas. In a case where both the first processing gas and the second processing gas contain a carbon containing gas, the carbon containing gas contained in each gas may be the same type of gas or a different gas. Here, the carbon containing gas may be, for example, either or both of a fluorocarbon gas and a hydrofluorocarbon gas. In an example, the fluorocarbon gas may be at least one selected from the group consisting of a $C_2F_2$ gas, a $C_2F_4$ gas, a $C_3F_6$ gas, a $C_3F_8$ gas, a $C_4F_6$ gas, a $C_4F_8$ gas, and a $C_5F_8$ gas. In an example, the hydrofluorocarbon gas may be at least one selected from the group consisting of a $CHF_3$ gas, a $CH_2F_2$ gas, a $CH_3F$ gas, a $C_2HF_5$ gas, a $C_2H_2F_4$ gas, a $C_2H_3F_3$ gas, a $C_2H_4F_2$ gas, a $C_3HF_7$ gas, a $C_3H_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas, and a $C_5H_3F_7$ gas. Further, the carbon containing gas may be a linear one having an unsaturated bond. The gas containing linear carbon having an unsaturated bond may be, for example, at least one selected from the group consisting of a $C_3F_6$ (hexafluoropropene) gas, a $C_4F_8$ (octafluoro-1-butene, octafluoro-2-butene) gas, a $C_3H_2F_4$ (1,3,3,3-tetrafluoropropene) gas, a $C_4H_2F_6$ (trans-1,1,1,4,4,4-hexafluoro-2-butene) gas, a $C_4F_8O$ (pentafluoroethyl trifluorovinyl ether) gas, a $CF_3COF$ (1,2,2,2-tetrafluoroethane-1-one) gas, a $CHF_2COF$ (difluoroacetic acid fluoride) gas, and a $COF_2$ (fluorinated carbonyl) gas.

The first processing gas and/or the second processing gas may further contain an oxygen containing gas. In a case where both the first processing gas and the second processing gas contain an oxygen containing gas, the oxygen containing gas contained in each gas may be the same type of gas or a different gas. Here, the oxygen containing gas may be, for example, at least one gas selected from the group consisting of $O_2$, CO, $CO_2$, $H_2O$, and $H_2O_2$. In an example, the oxygen containing gas may be an oxygen containing gas other than $H_2O$, for example, at least one gas selected from the group consisting of $O_2$, CO, $CO_2$, and $H_2O_2$. The flow rate of the oxygen containing gas may be adjusted according to the flow rate of the carbon containing gas.

The first processing gas and/or the second processing gas may further contain a gas containing halogen other than fluorine. In a case where both the first processing gas and the second processing gas contain a gas containing halogen other than fluorine, the gas containing halogen other than fluorine contained in each gas may be the same type of gas or a different gas. Here, the gas containing halogen other than fluorine may be a chlorine containing gas, a bromine containing gas, and/or an iodine containing gas. The chlorine containing gas may be, in an example, at least one gas selected from the group consisting of $Cl_2$, $SiCl_2$, $SiCl_4$, $CCl_4$, $SiH_2Cl_2$, $Si_2Cl_6$, $CHCl_3$, $SO_2Cl_2$, $BCl_3$, $PCl_3$, $PCl_5$, and $POCl_3$. The bromine containing gas may be, in an example, at least one gas selected from the group consisting of $Br_2$, HBr, $CBr_2F_2$, $C_2F_5Br$, $PBr_3$, $PBr_5$, $POBr_3$, and $BBr_3$. The iodine containing gas may be, in an example, at least one gas selected from the group consisting of HI, $CF_3I$, $C_2F_5I$, $C_3F_7I$, $IF_5$, $IF_7$, $I_2$, and $PI_3$. In an example, the gas containing halogen other than fluorine may be at least one selected from the group consisting of a $Cl_2$ gas, a $Br_2$ gas, and an HBr gas. In an example, the gas containing halogen other than fluorine is a $Cl_2$ gas or an HBr gas.

The first processing gas and/or the second processing gas may further contain an inert gas. In a case where both the first processing gas and the second processing gas contain an inert gas, the inert gas contained in each gas may be the same type of gas or a different gas. The inert gas may be, in an example, a noble gas such as an Ar gas, a He gas, or a Kr gas, or a nitrogen gas.

The first processing gas and/or the second processing gas may contain a gas capable of generating an HF species in the plasma, instead of or in addition to the HF gas. Here, the HF species contains at least any one of a gas, a radical, and an ion of hydrogen fluoride.

The gas capable of generating the HF species is, for example, a hydrofluorocarbon gas. The hydrofluorocarbon gas may have 2 or more, 3 or more, or 4 or more carbon atoms. The hydrofluorocarbon gas is, in an example, at least one selected from the group consisting of a $CH_2F_2$ gas, a $C_3H_2F_4$ gas, a $C_3H_2F_6$ gas, a $C_3H_3F_5$ gas, a $C_4H_2F_6$ gas, a $C_4H_5F_5$ gas, a $C_4H_2F_8$ gas, a $C_5H_2F_6$ gas, a $C_5H_2F_{10}$ gas, and a $C_5H_3F_7$ gas. The hydrofluorocarbon gas is, in an example, at least one selected from the group consisting of a $CH_2F_2$ gas, a $C_3H_2F_4$ gas, a $C_3H_2F_6$ gas, and a $C_4H_2F_6$ gas.

The gas capable of generating the HF species is, for example, a fluorine containing gas and a hydrogen containing gas. The fluorine containing gas is, for example, a fluorocarbon gas. The fluorocarbon gas is, in an example, at least one selected from the group consisting of a $C_2F_2$ gas, a $C_2F_4$ gas, a $C_3F_6$ gas, a $C_3F_8$ gas, a $C_4F_6$ gas, a $C_4F_8$ gas, and a $C_5F_8$ gas. Further, the fluorine containing gas may be, for example, an $NF_3$ gas or an $SF_6$ gas. The hydrogen containing gas is, in an example, at least one selected from the group consisting of an $H_2$ gas, a $CH_4$ gas, and an $NH_3$ gas.

Figure 4A:
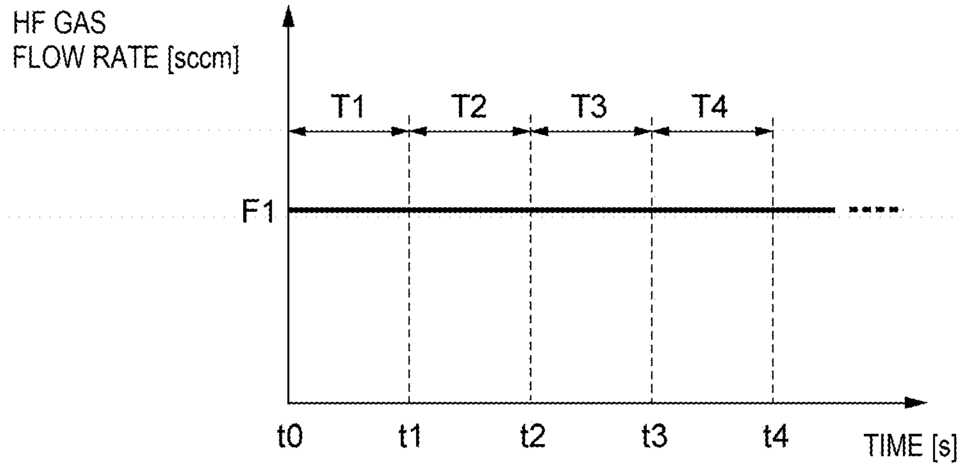
FIG. 4A is a timing chart illustrating an example of a flow rate of an HF containing gas supplied in step ST2.
Figure 4B:
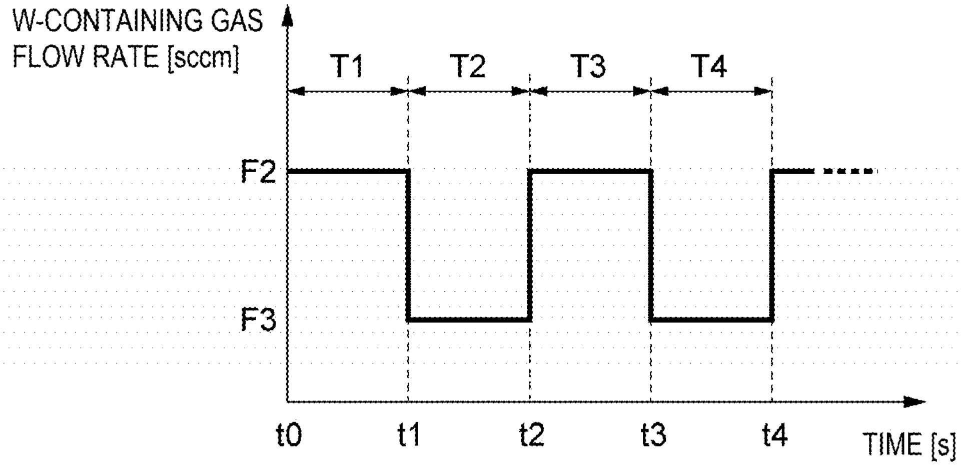
FIG. 4B is a timing chart illustrating an example of a flow rate of a tungsten containing gas supplied in step ST2.
Figure 4C:
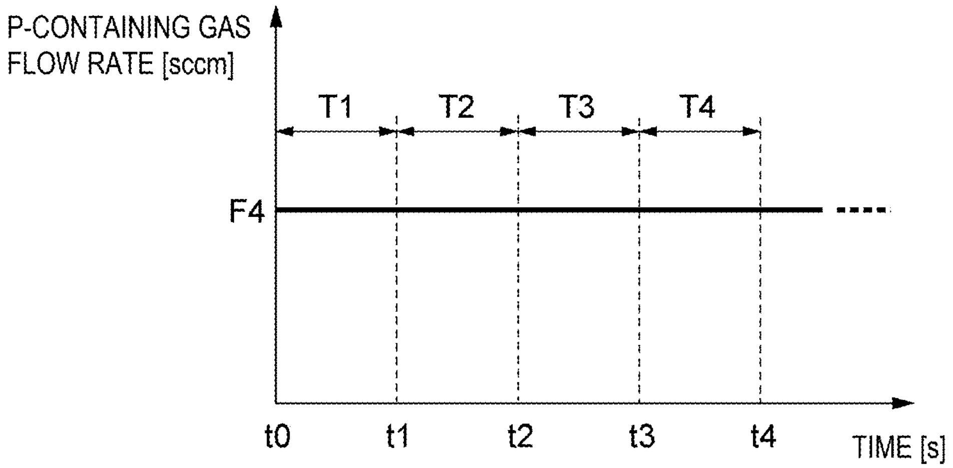
FIG. 4C is a timing chart illustrating an example of a flow rate of a phosphorus containing gas supplied in step ST2.

FIGS. 4A to 4C are timing charts illustrating examples of the flow rates of the HF gas, the tungsten containing gas, and the phosphorus containing gas in the processing gas (the first processing gas or the second processing gas) in step ST2. In FIGS. 4A to 4C, the vertical axis represents the flow rate of each gas, and the horizontal axis represents time. In FIG. 4A, F1 is a flow rate greater than zero. In FIG. 4B, F2 is a flow rate greater than zero, and F3 is a flow rate less than F2 or equal to zero. In an example, the relationship F1>F2>F3 holds. In FIG. 4C, F4 is a flow rate greater than or equal to zero. In FIGS. 4A to 4C, periods T1 (time t0 to time t1) and T3 (time t2 to time t3) correspond to step ST21. Further, periods T2 (time t1 to time t2) and T4 (time t3 to time t4) correspond to step ST22. The ratio between the duration (period T1/T3) of step ST21 and the duration (period T2/T4) of step ST22 may be appropriately set. This ratio may be set, for example, in consideration of the balance between the protection of the mask MF and the suppression of the blocking of the opening OP, which will be described later. The ratio may be set, for example, in the range of 1:11 to 11:1. Further, the duration of step ST21 may be the same or different for each cycle. That is, the periods T1 and T3 may be the same as or different from each other. For example, the duration of step ST21 may be set according to the number of cycles. In an example, the duration of step ST21 may be made shorter when the number of cycles exceeds a given number, or for every given number of cycles. In this way, the duration of step ST21 may be made shorter as a recess RC formId in the silicon containing film SF becomes deeper. Similarly, the duration of step ST22 may be the same or different for each cycle. That is, the periods T2 and T4 may be the same as or different from each other.

Figure 5A:
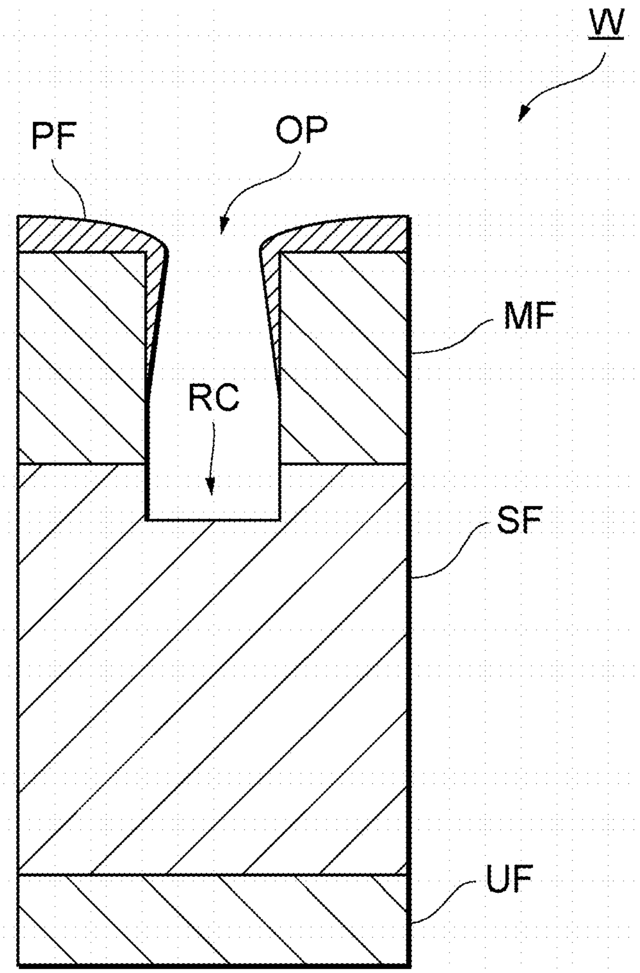
FIG. 5A is a diagram illustrating a cross-sectional structure of the substrate W during processing in step ST2.
Figure 5B:
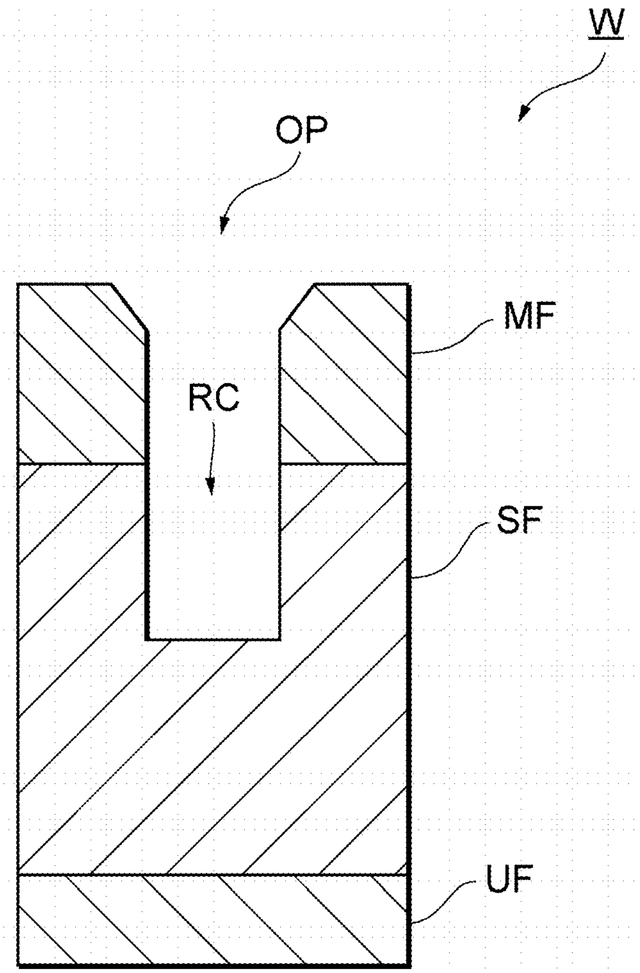
FIG. 5B is a diagram illustrating a cross-sectional structure of the substrate W during processing in step ST2.
Figure 5C:
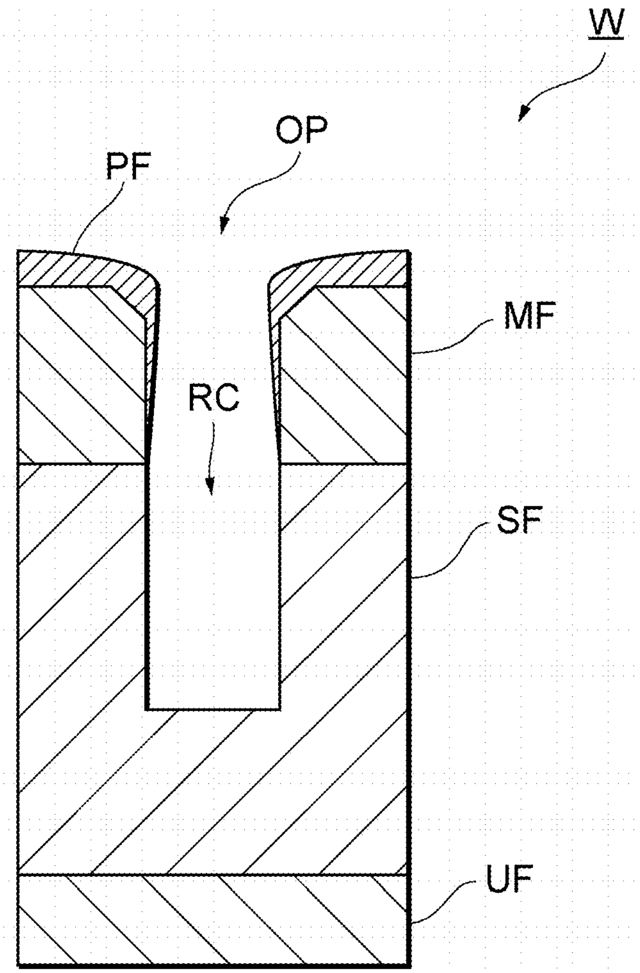
FIG. 5C is a diagram illustrating a cross-sectional structure of the substrate W during processing in step ST2.
Figure 5D:
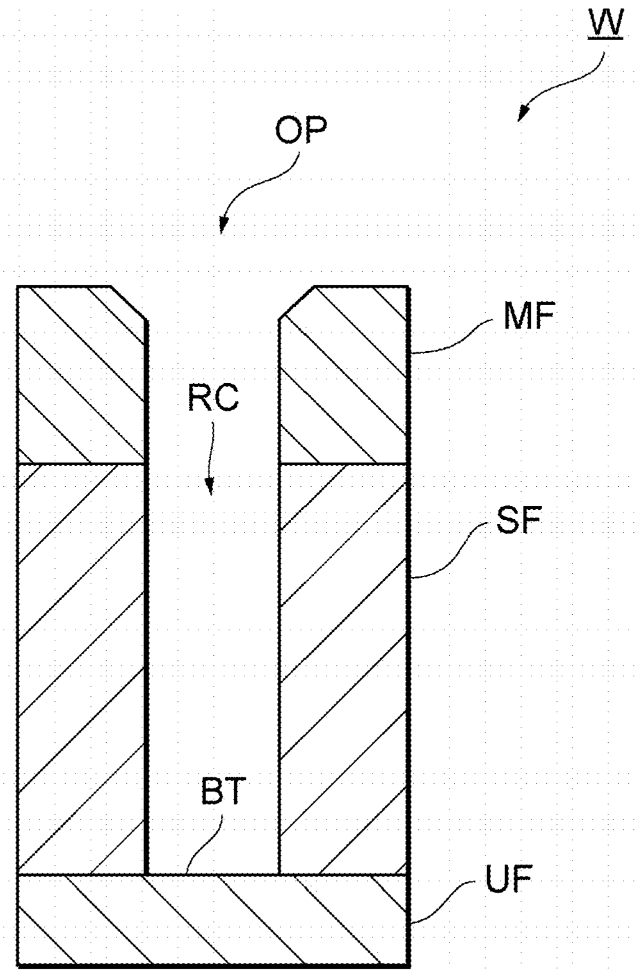
FIG. 5D is a diagram illustrating a cross-sectional structure of the substrate W during processing in step ST2.

FIGS. 5A to 5D are diagrams illustrating an example of a cross-sectional structure of the substrate W during processing in step ST2. FIG. 5A illustrates an example of the cross-sectional structure of the substrate W at the end of the period T1 illustrated in FIGS. 4A to 4C. Similarly, FIGS. 5B to 5D illustrate an example of the cross-sectional structure of the substrate W at the ends of the periods T2 to T4, respectively.

As illustrated in FIG. 5A, a portion of the silicon containing film SF exposed in the opening OP is etched in a depth direction (the direction from the top to the bottom in FIG. 5A) by the processing in the period T1 (step ST21 of the first cycle), whereby the recess RC is formed. Further, a protective film PF containing tungsten is formed on the mask MF. It is considered that the protective film PF is formed by adhering and depositing a tungsten species in the plasma generated from the first processing gas on the mask MF. The protective film PF is formed on the sidewall of the mask MF. The protective film PF may be formed over an upper surface of the mask MF and at least some of the recess RC. The protective film PF may contain a by-product of the etching.

The tungsten in the protective film PF has low reactivity with the HF species in the plasma and provides protection for the mask MF. That is, the protective film PF suppresses the shape deterioration of the mask MF due to the removal of the sidewall of the mask MF by the HF species. Since the shape deterioration of the mask MF is suppressed, the ions that collide with the sidewall of the mask MF and go toward a sidewall of the silicon containing film SF decrease. As a result, the etching (bowing) of the sidewall of the silicon containing film SF In a lateral direction (a left-right direction of FIGS. 5A to 5D) is suppressed. Bowing is one of the shape abnormalities of etching.

As illustrated in FIG. 5B, the silicon containing film SF is further etched in the depth direction by the processing in the period T2 (step ST22 of the first cycle), and the depth of the recess RC increases. The flow rate of the tungsten containing gas supplied into the plasma processing space 10*s* in the period T2 (step ST22) is smaller than that in the period T1 (step ST21) or equal to zero (see FIG. 4B). Therefore, during the period T2, the deposition of the tungsten containing film on the mask MF decreases or becomes zero, and the protective film PF is gradually scraped off. Then, some or all of the protective film PF is removed at the end of the period T2 (step ST22). As a result, the narrowing in the width or the blocking of the opening OP due to the protective film PF is suppressed. Some of the sidewall of the mask MF may be removed at the end of the period T2.

As illustrated in FIG. 5C, the silicon containing film SF is further etched in the depth direction by the processing in the period T3 (step ST21 of the second cycle), and the depth of the recess RC increases. Further, as in the period T1 (step ST21 of the first cycle), the protective film PF is again formed on the mask MF. As described above, the protective film PF can provide protection for the mask MF and suppress the occurrence of bowing in the silicon containing film SF.

As illustrated in FIG. 5D, the silicon containing film SF is further etched in the depth direction by the processing in the period T4 (step ST22 of the second cycle), and the depth of the recess RC increases. Then, as in the period T2 (step ST22 of the first cycle), some or all of the protective film PF is removed at the end of the period T4 (step ST22). Some of the sidewall of the mask MF may be removed at the end of the period T4. Although FIG. 5D illustrates an example in which a bottom BT reaches the underlying film UF at the end of the period T4, the present disclosure is not limited thereto, and the bottom BT may reach the underlying film UF after three or more cycles. The aspect ratio of the recess RC in a state in which the bottom BT reaches the underlying film UF may be, for example, 20 or more, 30 or more, 40 or more, 50 or more, or 100 or more.

The present processing method repeats the cycle including step ST21 and step ST22 until determination is made in step ST23 that the stop condition is satisfied. In step ST21 (periods T1 and T3), the formation of the protective film PF suppresses the shape deterioration of the mask MF attendant on the etching, whereby the bowing of the silicon containing film SF can be suppressed. Further, in step ST22 (periods T2 and T4), the removal of some or all of the protective film PF formed in step ST21 suppresses the blocking of the opening OP, so that the decrease in the etching rate of the silicon containing film SF can be suppressed. In this way, with the present processing method, the formation (step ST21) and the removal (step ST22) of the protective film PF are alternately repeated, so that it is possible to perform the etching while balancing the protection of the mask MF and the suppression of the blocking of the opening OP. That Is, it is possible to etch the silicon containing film SF while suppressing both the shape deterioration caused by the bowing and the decrease in the etching rate.

Modification Examples

Various modifications may be made to the embodiment of the present disclosure without departing from the scope and gist of the present disclosure.

For example, FIG. 4A illustrates an example in which the flow rate of the HF gas is constant throughout step ST2, but the present disclosure is not limited thereto. In an example, the flow rate and/or the flow ratio with respect to the processing gas (hereinafter, also referred to as a "flow rate/flow ratio") of the HF gas may be made different between step ST21 (such as the periods T1 and T3) and step ST22 (such as the periods T2 and T4). Further, the flow rate/flow ratio of the HF gas may be changed for each cycle, and the flow rate/flow ratio may be, for example, different between one cycle (periods T1 and T2) and another cycle (periods T3 and T4). Further, for example, the flow rate/flow ratio of the HF gas may be changed in the middle of each etching in step ST21 and step ST22. In an example, the flow rate/flow ratio of the HF gas may be gradually or stepwise increased or decreased during the period T1 (the same applies to the periods T2, T3, T4, and the like). In a case where the first processing gas or the second processing gas contains another gas such as a phosphorus containing gas, the flow rate of the other gas may not be constant throughout step ST2 and may be appropriately changed as described above.

Further, for example, in the example illustrated in FIG. 4B, the flow rate (F2) of the tungsten containing gas in step ST21 (such as the periods T1 and T3) and the flow rate/flow ratio of the tungsten containing gas in step ST22 (such as the periods T2 and T4) are each constant, but the present disclosure is not limited thereto. For example, the flow rate/flow ratio of the tungsten containing gas may be made different between one cycle (period T1) and another cycle (period T3), which include step ST21. Further, the flow rate/flow ratio of the tungsten containing gas may be made different between one cycle (period T2) and another cycle (period T4), which include step ST22. In one embodiment, the flow rate/flow ratio of the tungsten containing gas may be set according to the number of cycles. For example, when the number of cycles exceeds a given number, or for every given number of cycles, the flow rate/flow ratio of the tungsten containing gas in step ST21 (such as the period T3) may be made smaller. In this way, the flow rate/flow ratio of the tungsten containing gas may be made smaller as the recess RC formed by the etching becomes deeper. In an example, the flow rate/flow ratio of the tungsten containing gas in step ST21 (such as the period T3) of at least one cycle after the second cycle may be made smaller than the flow rate/flow ratio of the tungsten containing gas in step ST21 (the period T1) of the first cycle. The reduction amount of the flow rate/flow ratio of the tungsten containing gas may be appropriately set, and, in an example, is ⅓ or less of the first cycle. Further, for example, the flow rate/flow ratio of the tungsten containing gas may be changed in the middle of each etching in step ST21 and step ST22. In an example, the flow rate/flow ratio of the tungsten containing gas may be gradually or stepwise increased or decreased during the periods T1 (the same applies to the periods T2, T3, T4, and the like).

Figure 6:
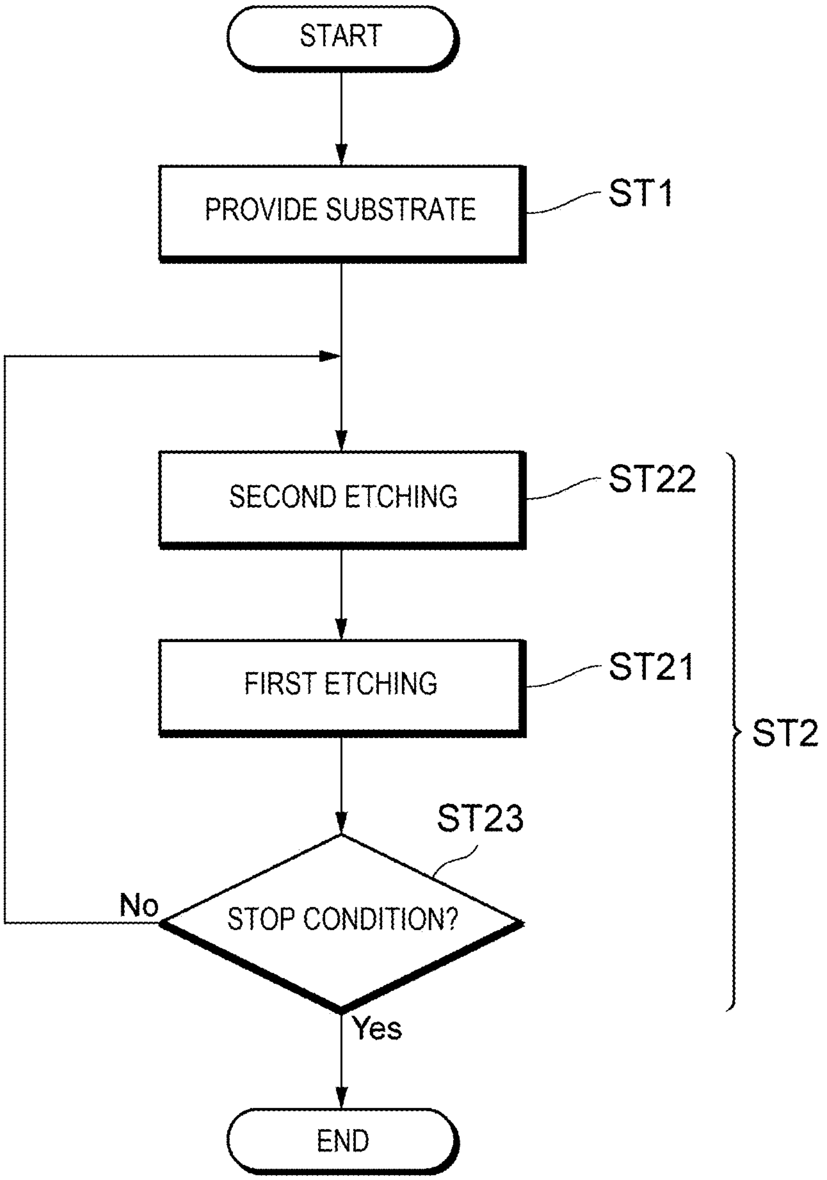
FIG. 6 is a flowchart illustrating a modification example of the present processing method.

Further, for example, as illustrated in FIG. 6, the order of step ST21 and step ST22 may be reversed. That is, first, the etching of the silicon containing film SF may be performed using the second processing gas (step ST22), and then the etching of the silicon containing film SF may be performed using the first processing gas (step ST21).

Figure 7:
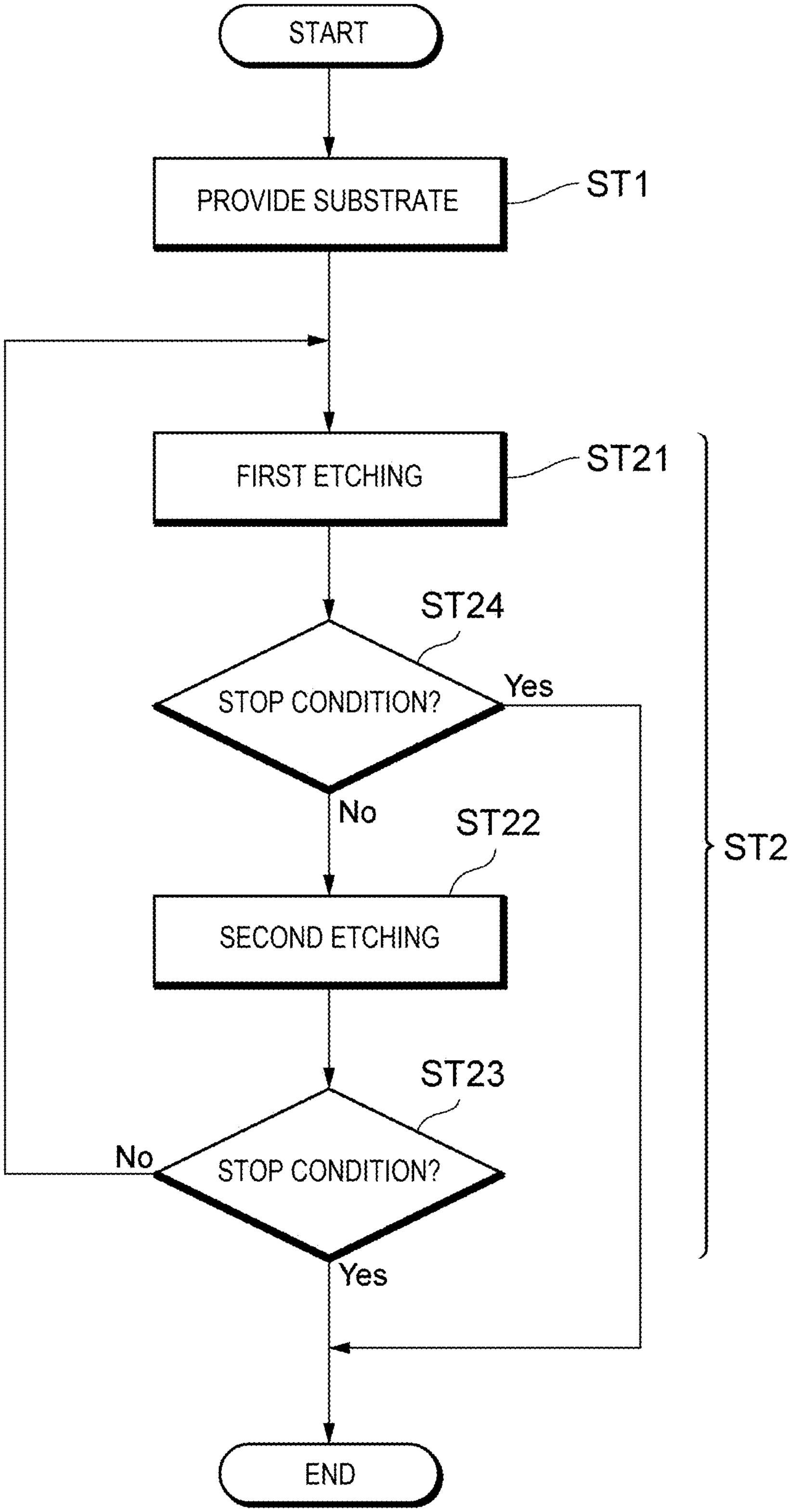
FIG. 7 is a flowchart illustrating a modification example of the present processing method.

Further, for example, as illustrated in FIG. 7, whether the stop condition is satisfied may be also determined after the end of step ST21. That is, in a case where whether the stop condition is satisfied is determined after the end of step ST21 (step ST24) and the stop condition is satisfied, the etching may be ended without proceeding to step ST22.

In another aspect of the present disclosure, instead of alternately executing step ST21 (first etching) and step ST22 (second etching) from the start or in the middle of step ST2, only step ST21 may be executed. In this case, the flow ratio of the tungsten containing gas in step ST21 may be 0.1% by volume or more and 0.3% by volume or less with respect to the total flow rate of the processing gas excluding the inert gas.

Further, for example, the present processing method may be executed using a plasma processing apparatus with any plasma source, such as inductively-coupled plasma or microwave plasma, in addition to the capacitively-coupled plasma processing apparatus 1.

EXAMPLES

Next, Examples of the present processing method will be described. The present disclosure is not limited to the following Examples.

Example 1

In Example 1, the present processing method was applied using the plasma processing apparatus 1, and a substrate having a structure similar to the substrate W illustrated in FIG. 3 was etched. As the mask MF, an amorphous carbon film was used. As the silicon containing film SF, a stacked film in which silicon nitride films and silicon oxide films were alternately and repeatedly stacked was used. The first processing gas used in step ST21 contained an HF gas, a phosphorus containing gas, and a $WF_6$ gas. The second processing gas used in step ST22 contained an HF gas and a phosphorus containing gas. Then, the cycle of step ST21 (30 seconds) and step ST22 (30 seconds) was repeated for 15 cycles, and the etching was performed for a total of 15 minutes. During the etching, the temperature of the substrate support 11 was set to 10° C.

Reference Examples 1 and 2

In Reference Examples 1 and 2, the substrate having the same configuration as that in Example 1 was etched using the plasma processing apparatus 1. In Reference Example 1, the etching was performed for 15 minutes using the same processing gas as the first processing gas used in Example 1. Further, in Reference Example 2, etching was performed for 15 minutes using a processing gas having the same configuration as the second processing gas used in Example 1. In both Reference Examples 1 and 2, the temperature of the substrate support 11 was set to 10° C. during the etching.

The etching depth D [nm] of the silicon containing film SF after the etching of Example 1, and Reference Examples 1 and 2, bowing (maximum opening width) B [nm], the ratio B/D of bowing (B) to the etching depth (D), and the etching rate E [nm/min] are as shown in Table 1.

TABLE 1

| | Example 1 | Reference Example 1 | Reference Example 2 |
|---|---|---|---|
| D[nm] | 6736 | 6295 | 7805 |
| B[nm] | 179.8 | 215.8 | 685.7 |
| B/D | 0.027 | 0.034 | 0.088 |
| E[nm/min] | 449.1 | 419.7 | 520.3 |

In Example 1, the ratio (B/D) of bowing (B) to the etching depth (D) was low, and bowing was further suppressed, as compared with Reference Example 1. Further, in Example 1, the etching rate was higher than that in Reference Example 1. In Example 1, as compared with Reference Example 2, the etching rate was low, but the ratio (B/D) of bowing to the etching depth D was significantly low, and the bowing was significantly suppressed. That is, in the etching of the silicon containing film SF in Example 1, the reduction of the etching rate was suppressed while the bowing is suppressed, as compared with Reference Examples 1 and 2.

Example 2

In Example 2, the present processing method was applied using the plasma processing apparatus 1, and the substrate having the same configuration as that in Example 1 was etched. That is, a substrate having a structure similar to the substrate W illustrated in FIG. 3 was etched. As the mask MF, an amorphous carbon film was used. As the silicon containing film SF, a stacked film in which silicon nitride films and silicon oxide films were alternately and repeatedly stacked was used. The first processing gas used in step ST21 contained an HF gas, a phosphorus containing gas, an $O_2$ gas, and a $WF_6$ gas. The second processing gas used in step ST22 contained an HF gas, a phosphorus containing gas, and an $O_2$ gas. The cycle of step ST21 (15 seconds) and step ST22 (45 seconds) was repeated for 15 cycles, and the etching was performed for a total of 15 minutes. During the etching, the temperature of the substrate support 11 was set to 10° C.

Reference Example 3

In Reference Example 3, the substrate having the same configuration as that in Example 1 was etched using the plasma processing apparatus 1. In Reference Example 3, etching was performed for a total of 17.5 minutes by repeating a cycle of etching (25 seconds) using a $C_4F_8$ gas, a $C_4F_6$ gas, a $CHF_3$ gas, a $CH_2F_2$ gas, and an $O_2$ gas, as a processing gas, and etching (50 seconds) using a $C_4F_8$ gas, a $C_4F_6$ gas, a $CH_2F_2$ gas, an $O_2$ gas, and a Kr gas, as a processing gas, for 14 cycles. During the etching, the temperature of the substrate support 11 was set to 10° C.

The etching depth D [nm] of the silicon containing film SF after the etching of Example 2 and Reference Example 3, bowing (maximum opening width) B [nm], the ratio B/D of bowing (B) to the etching depth (D), and the etching rate E [nm/min] are as shown in Table 2.

TABLE 2

| | Example 2 | Reference Example 3 |
|---|---|---|
| D[nm] | 9181 | 6164 |
| B[nm] | 194.7 | 154.4 |
| B/D | 0.021 | 0.025 |
| E[nm/min] | 612.1 | 352.2 |

Example 2 has a significantly higher etching rate than that in Reference Example 3. Further, in Example 2, the ratio (B/D) of bowing (B) to the etching depth (D) was lower than that in Reference Example 3 to the same level or more, and the bowing was also suppressed. That is, in Example 2, the bowing was suppressed while the etching rate was significantly increased, as compared with Reference Example 3.

Example 3

In Example 3, the present processing method was applied using the plasma processing apparatus 1, and the substrate having the same configuration as that in Example 1 was etched. The first processing gas used in step ST21 contained an HF gas, a phosphorus containing gas, a $WF_6$ gas, a halogen containing gas, a hydrofluorocarbon gas, and a fluorocarbon gas. The second processing gas used in step ST22 is similar to the first processing gas except that the second processing gas does not contain the $WF_6$ gas. In step ST2, the etching was performed for a total of 11 minutes by repeating step ST21 (20 seconds) and step ST22 (40 seconds) for 11 cycles.

Example 4

Example 4 is similar to Example 3 except that, in step ST2, the cycle of step ST21 (40 seconds) and step ST22 (20 seconds) was repeated.

Reference Examples 4 and 5

In Reference Examples 4 and 5, the substrate having the same configuration as that in Example 1 was etched using the plasma processing apparatus 1. In Reference Example 4, the etching was performed for 11 minutes using the same processing gas as the second processing gas used in Example 3. Further, in Reference Example 5, etching was performed for 11 minutes using a processing gas having the same configuration as the first processing gas used in Example 1.

Table 3 shows the results of the etching of Examples 3 and 4 and Reference Examples 4 and 5. In Table 3, D [nm] represents the etching depth of the silicon containing film SF after the etching. B [nm] represents bowing (maximum opening width). BT [nm] represents the opening width at the bottom of the recess RC, specifically, at a depth of 5 μm from the interface between the mask MF and the recess RC.

TABLE 3

| | Example 3 | Example 4 | Reference Example 4 | Reference Example 5 |
|---|---|---|---|---|
| D[nm] | 5346 | 5700 | 5234 | 5600 |
| B[nm] | 111 | 108 | 105 | 106 |
| BT[nm] | 61 | 56 | 38 | 45 |

As shown in Table 3, in Examples 3 and 4, the opening width of the bottom of the recess RC was wider than that in Reference Examples 4 and 5, and tapering was suppressed. Bowing in Examples 3 and 4 was suppressed to the same level as that in Reference Examples 4 and 5.

Figure 8:
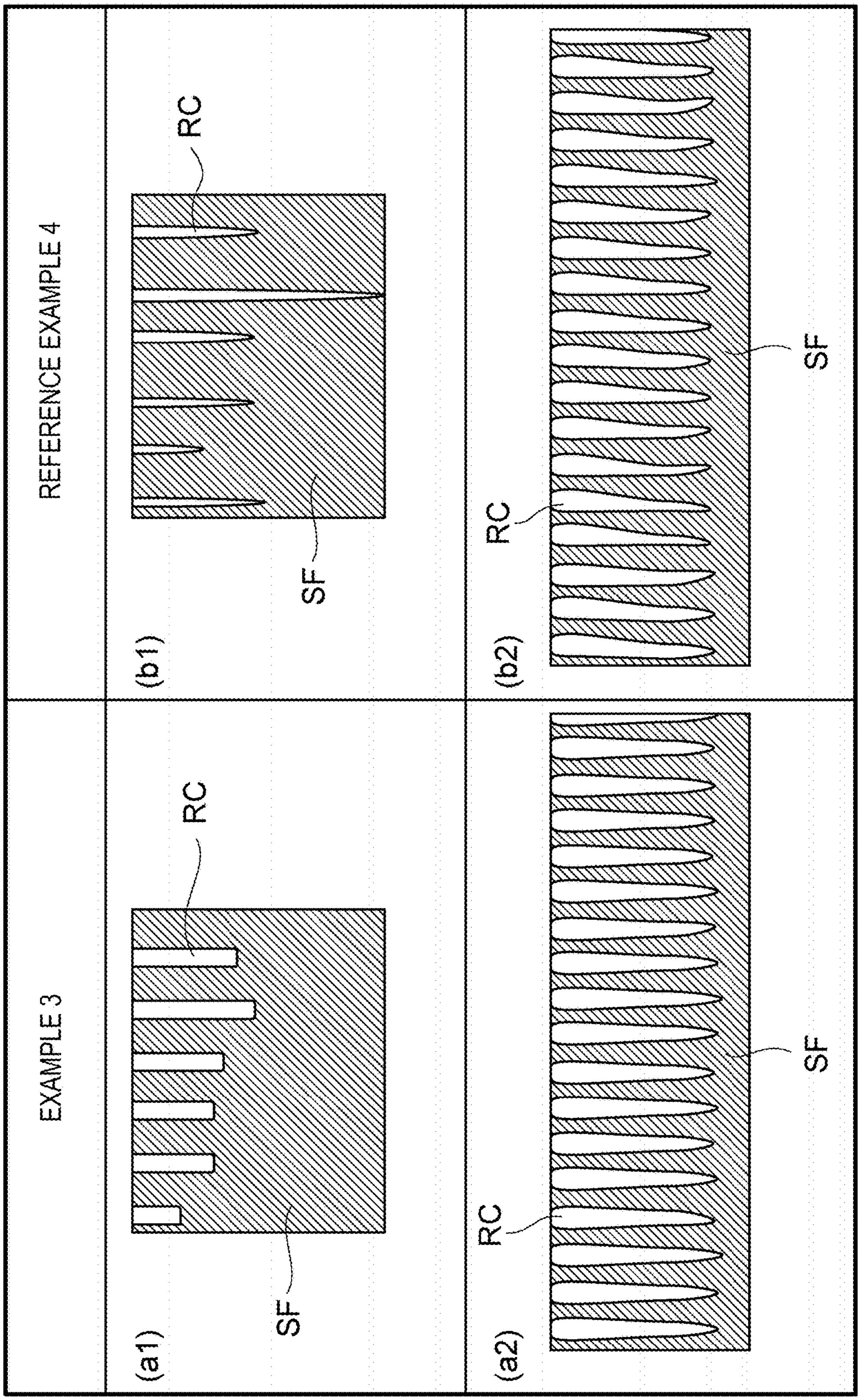
FIG. 8 is a diagram illustrating etching results of Example 3 and Reference Example 4.

FIG. 8 is a diagram illustrating the etching results of Example 3 and Reference Example 4. In FIG. 8, (a1) and (b1) are diagrams illustrating cross-sectional shapes of the bottoms of the recesses RC after the etching according to Example 3 and Reference Example 4, respectively. (a2) and (b2) are diagrams illustrating cross-sectional shapes of the recesses RC after the etching according to Example 3 and Reference Example 4, respectively.

As illustrated in (a1) of FIG. 8, in the etching according to Example 3, the opening width of the bottom of the recess RC was not large, and the cross-sectional shape of the bottom was a rectangular shape. On the other hand, as illustrated in (b1) of FIG. 8, in the etching according to Reference Example 4, the opening width of the bottom of the recess RC was small, and the cross-sectional shape tapered toward the bottom. Further, as illustrated in (a2) of FIG. 8, in the etching according to Example 3, each of a plurality of recesses RC was etched along the depth direction, and bending or twist was suppressed. On the other hand, as illustrated in (b2) of FIG. 8, in the etching according to Reference Example 4, some of a plurality of recesses RC were bent or twisted.

Figure 9:
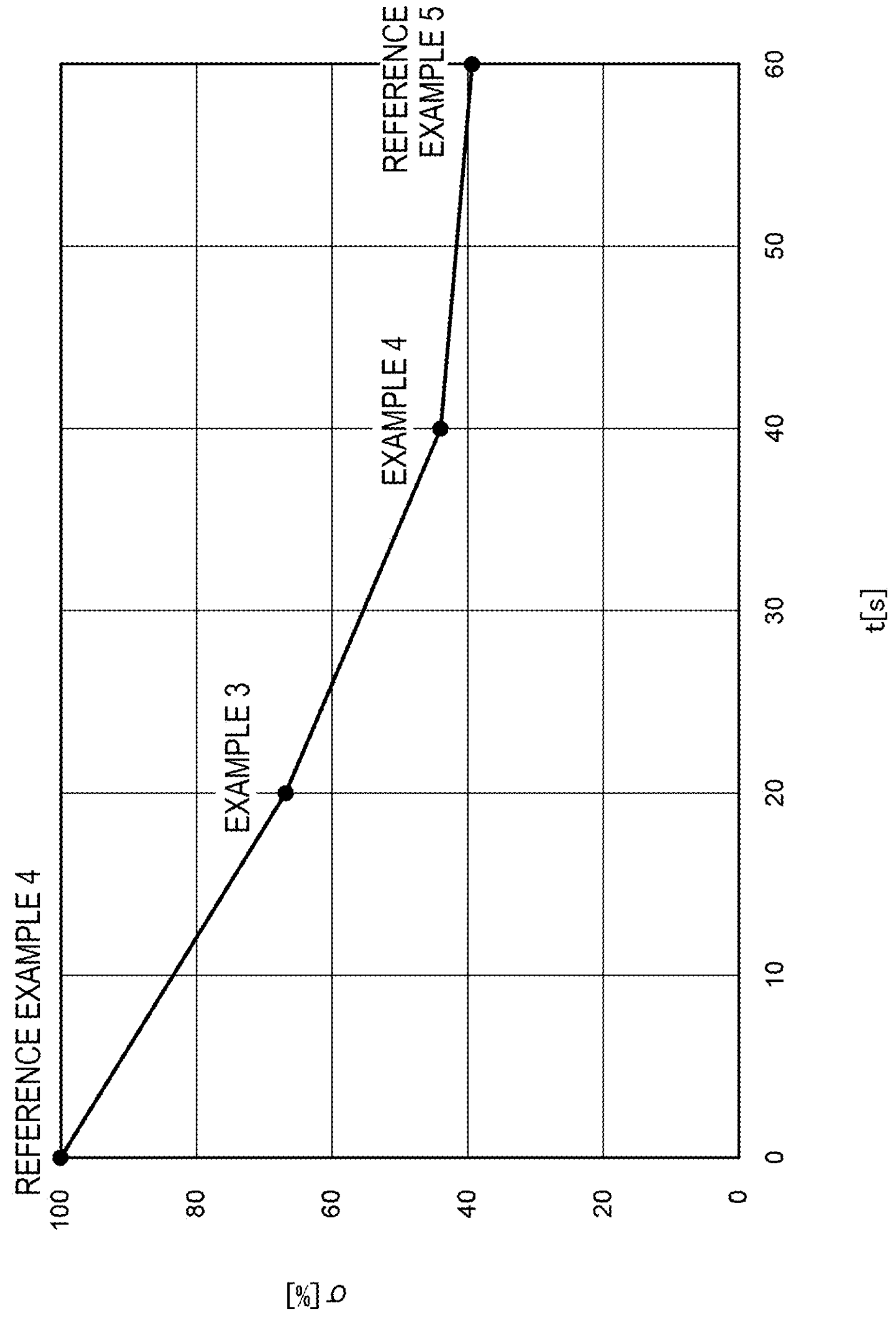
FIG. 9 is a diagram illustrating etching results of Examples 3 and 4 and Reference Examples 4 and 5.

FIG. 9 is a diagram illustrating the etching results of Examples 3 and 4 and Reference Examples 4 and 5. FIG. 9 illustrates the relationship between the duration of step ST21 and the twist caused by the etching. In FIG. 9, the vertical axis represents the twist amount a [%] in a case where the twist amount of the recess RC in Reference Example 4 is 100%. The horizontal axis represents the duration of step ST21 in one cycle (60 seconds) of step ST2 (Reference Example 4 is represented by 0 seconds because step ST21 is not performed, and Reference Example 5 is represented by 60 seconds because only step ST21 is performed).

As illustrated in FIG. 9, in each of Examples 3 and 4 and Reference Example 5, twist was suppressed as compared with Reference Example 4, and twist was further suppressed as the duration of step ST21 in one cycle was longer.

Embodiments of the present disclosure further include the following aspects.

(Appendix 1)

A plasma processing method executed by a plasma processing apparatus having a chamber, the plasma processing method including:

(a) providing a substrate having a silicon containing film and a mask on the silicon containing film; and (b) etching the silicon containing film, the (b) including (b-1) etching the silicon containing film by using a plasma generated from a first processing gas containing a hydrogen fluoride gas and a tungsten containing gas, and (b-2) etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

(Appendix 2)

The plasma processing method according to Appendix 1, in which in the (b), the (b-1) and the (b-2) are alternately repeated.

(Appendix 3)

The plasma processing method according to Appendix 1, in which in the (b), a cycle including the (b-1) and the (b-2) is repeated a plurality of times, and in the (b-1) of at least one cycle after a second cycle, the flow ratio of the tungsten containing gas to the first processing gas is smaller than the flow ratio in the (b-1) of a first cycle.

(Appendix 4)

The plasma processing method according to any one of Appendices 1 to 3, in which at least one selected from a group consisting of the tungsten containing gas contained in the first processing gas and the tungsten containing gas contained in the second processing gas is a $WF_aCl_b$ (a and b are each an integer of 0 or more and 6 or less, and a sum of a and b is 2 or more and 6 or less) gas.

(Appendix 5)

The plasma processing method according to any one of Appendices 1 to 4, in which at least one selected from a group consisting of the tungsten containing gas contained in the first processing gas and the tungsten containing gas contained in the second processing gas is at least one gas selected from a group consisting of a $WF_6$ gas and a $WCl_6$ gas.

(Appendix 6)

The plasma processing method according to any one of Appendices 1 to 5, in which in the first processing gas, a flow rate of the hydrogen fluoride gas is a largest among all gases excluding an inert gas.

(Appendix 7)

The plasma processing method according to any one of Appendices 1 to 6, in which in the first processing gas, a flow rate of the tungsten containing gas is a smallest among all gases excluding an inert gas.

(Appendix 8)

The plasma processing method according to any one of Appendices 1 to 7, in which in the first processing gas, a flow rate of the hydrogen fluoride gas is 10 times or more than a flow rate of the tungsten containing gas.

(Appendix 9)

The plasma processing method according to any one of Appendices 1 to 8, in which at least one selected from a group consisting of the first processing gas and the second processing gas further contains a phosphorus containing gas.

(Appendix 10)

The plasma processing method according to Appendix 9, in which the phosphorus containing gas is a halogenated phosphorus gas.

(Appendix 11)

The plasma processing method according to any one of Appendices 1 to 10, in which at least one selected from a group consisting of the first processing gas and the second processing gas further contains a carbon containing gas.

(Appendix 12)

The plasma processing method according to Appendix 11, in which the carbon containing gas is either a fluorocarbon gas or a hydrofluorocarbon gas.

(Appendix 13)

The plasma processing method according to any one of Appendices 1 to 12, in which at least one selected from a group consisting of the first processing gas and the second processing gas further contains an oxygen containing gas.

(Appendix 14)

The plasma processing method according to any one of Appendices 1 to 13, in which at least one selected from a group consisting of the first processing gas and the second processing gas further contains a gas containing halogen other than fluorine.

(Appendix 15)

The plasma processing method according to any one of Appendices 1 to 14, in which the mask has a hole pattern or a slit pattern.

(Appendix 16)

A plasma processing method executed by a plasma processing apparatus having a chamber, the plasma processing method including:

(a) providing a substrate having a silicon containing film and a mask on the silicon containing film; and (b) etching the silicon containing film, the (b) including (b-1) etching the silicon containing film by using a first plasma containing a hydrogen fluoride species and a chemical species containing at least one selected from a group consisting of tungsten, titanium and molybdenum, and (b-2) etching the silicon containing film by using a second plasma containing a hydrogen fluoride species, the second plasma not containing the chemical species, or containing the chemical species at a partial pressure lower than a partial pressure of the chemical species in the first plasma.

(Appendix 17)

The plasma processing method according to Appendix 16, in which in the (b), the (b-1) and the (b-2) are alternately repeated.

(Appendix 18)

The plasma processing method according to Appendix 16 or 17, in which the hydrogen fluoride species is generated from at least one gas selected from a group consisting of a hydrogen fluoride gas or a hydrofluorocarbon gas.

(Appendix 19)

The plasma processing method according to Appendix 16 or 17, in which the hydrogen fluoride species is generated from a hydrofluorocarbon gas having 2 or more carbon atoms.

(Appendix 20)

The plasma processing method according to Appendix 16 or 17, in which the hydrogen fluoride species is generated from a fluorine containing gas and a hydrogen containing gas.

(Appendix 21)

The plasma processing method according to any one of Appendices 16 to 20, in which at least one selected from a group consisting of the first plasma and the second plasma further contains a phosphorus containing species.

(Appendix 22)

A plasma processing system including:

a chamber;

a substrate support provided inside the chamber;

a plasma generator; and a controller configured to execute (a) control of providing a substrate having a silicon containing film and a mask on the silicon containing film onto the substrate support, and (b) control of etching the silicon containing film, the (b) control including (b-1) control of etching the silicon containing film by using a plasma generated from a first processing gas containing a hydrogen fluoride gas and a tungsten containing gas, and (b-2) control of etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

(Appendix 23)

A device production method executed by a plasma processing apparatus having a chamber, the device production method including:

(a) providing a substrate having a silicon containing film and a mask on the silicon containing film; and (b) etching the silicon containing film, the (b) including (b-1) etching the silicon containing film by using a plasma generated from a first processing gas containing a hydrogen fluoride gas and a tungsten containing gas, and (b-2) etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

(Appendix 24)

A program causing a computer of a plasma processing system including a chamber, a substrate support provided inside the chamber, and a plasma generator to execute:

(a) control of providing a substrate having a silicon containing film and a mask on the silicon containing film onto the substrate support; and (b) control of etching the silicon containing film, the (b) control including (b-1) control of etching the silicon containing film by using a plasma generated from a first processing gas containing a hydrogen fluoride gas and a tungsten containing gas, and (b-2) control of etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas.

(Appendix 25)

A recording medium storing the program according to Appendix 24.

According to one exemplary embodiment of the present disclosure, a technique of suppressing a shape abnormality of etching can be provided.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing method executed by a plasma processing apparatus having a chamber, the plasma processing method comprising:

(a) providing a substrate having a silicon containing film and a mask on the silicon containing film; and (b) etching the silicon containing film, the (b) etching including (b-1) etching the silicon containing film by using a plasma generated from a first processing gas containing a hydrogen fluoride gas and a tungsten containing gas, and (b-2) etching the silicon containing film by using a plasma generated from a second processing gas containing a hydrogen fluoride gas, the second processing gas not containing a tungsten containing gas, or containing a tungsten containing gas at a flow ratio smaller than a flow ratio of the tungsten containing gas in the first processing gas, wherein at least one member selected from a group consisting of the first processing gas and the second processing gas further contains a phosphorus containing gas, and wherein the phosphorus containing gas is phosphorus oxide gas, a phosphorus gas containing a halogen element other than fluorine, a halogenated phosphoryl gas, a phosphine-based gas, a $PCl_aF_b$ (a is an integer of 1 or more, b is an integer of 0 or more, and a+b is an integer of 5 or less) gas, a $PC_cH_dF_e$ (d and e are each an integer of 1 or more and 5 or less, and c is an integer of 0 or more and 9 or less) gas, a $PCl_vF_wC_xH_y$ gas (v, w, x, and y are each an integer of 1 or more), a gas containing phosphorus, fluorine, and halogen other than fluorine in its molecular structure, a gas containing phosphorus, fluorine, carbon, and hydrogen in its molecular structure, or a gas containing phosphorus, fluorine, and hydrogen in its molecular structure.

2. The plasma processing method according to claim 1, wherein in the (b) etching, the (b-1) and the (b-2) are alternately repeated.

3. The plasma processing method according to claim 1, wherein in the (b) etching, a cycle including the (b-1) and the (b-2) is repeated a plurality of times, and in the (b-1) of at least one cycle after a second cycle, the flow ratio of the tungsten containing gas to the first processing gas is smaller than the flow ratio in the (b-1) of a first cycle, or a time of the (b-1) of at least one cycle after the second cycle is shorter than a time of the (b-1) of the first cycle.

4. The plasma processing method according to claim 1, wherein at least one member selected from a group consisting of the tungsten containing gas contained in the first processing gas and the tungsten containing gas contained in the second processing gas contains a $WF_aCl_b$ (wherein a and b are each an integer of 0 or more and 6 or less, and a sum of a and b is 2 or more and 6 or less) gas.

5. The plasma processing method according to claim 1, wherein at least one member selected from a group consisting of the tungsten containing gas contained in the first processing gas and the tungsten containing gas contained in the second processing gas contains at least one gas selected from a group consisting of a $WF_6$ gas and a $WCl_6$ gas.

6. The plasma processing method according to claim 1, wherein in the first processing gas, a flow rate of the hydrogen fluoride gas is a largest among all gases excluding any inert gas.

7. The plasma processing method according to claim 1, wherein in the first processing gas, a flow rate of the tungsten containing gas is a smallest among all gases excluding any inert gas.

8. The plasma processing method according to claim 1, wherein in the first processing gas, a flow rate of the hydrogen fluoride gas is 10 times or more than a flow rate of the tungsten containing gas.

9. The plasma processing method according to claim 1, wherein the phosphorus containing gas is a halogenated phosphorus gas.

10. The plasma processing method according to claim 1, wherein at least one member selected from a group consisting of the first processing gas and the second processing gas further contains a carbon containing gas.

11. The plasma processing method according to claim 10, wherein the carbon containing gas is either a fluorocarbon gas or a hydrofluorocarbon gas.

12. The plasma processing method according to claim 1, wherein at least one member selected from a group consisting of the first processing gas and the second processing gas further contains an oxygen containing gas.

13. The plasma processing method according to claim 1, wherein at least one member selected from a group consisting of the first processing gas and the second processing gas further contains a gas containing halogen other than fluorine.

14. The plasma processing method according to claim 1, wherein the mask has a hole pattern or a slit pattern.

15. The plasma processing method according to claim 1, wherein the phosphorus containing gas is a $PCl_aF_b$ gas where a is an integer of 1 or more, b is an integer of 0 or more, and a+b is an integer of 5 or less or a halogenated phosphoryl gas.

16. The plasma processing method according to claim 1, wherein the phosphorus containing gas is $PCl_3$ or $POCl_3$.

17. A plasma processing method executed by a plasma processing apparatus having a chamber, the plasma processing method comprising:

(a) providing a substrate having a silicon containing film and a mask on the silicon containing film; and (b) etching the silicon containing film, the (b) etching including (b-1) etching the silicon containing film by using a first plasma containing a hydrogen fluoride species and a chemical species containing at least one member selected from a group consisting of tungsten, titanium and molybdenum, and (b-2) etching the silicon containing film by using a second plasma containing a hydrogen fluoride species, the second plasma not containing the chemical species, or containing the chemical species at a partial pressure lower than a partial pressure of the chemical species in the first plasma, wherein at least one member selected from a group consisting of the first plasma and the second plasma further contains a phosphorus containing gas, and wherein the phosphorus containing gas is phosphorus oxide gas, a phosphorus gas containing a halogen element other than fluorine, a halogenated phosphoryl gas, a phosphine-based gas, a $PCl_aF_b$ (a is an integer of 1 or more, b is an integer of 0 or more, and a+b is an integer of 5 or less) gas, a $PC_cH_dF_e$ (d and e are each an integer of 1 or more and 5 or less, and c is an integer of 0 or more and 9 or less) gas, a $PCl_vF_wC_xH_y$ gas (v, w, x, and y are each an integer of 1 or more), a gas containing phosphorus, fluorine, and halogen other than fluorine in its molecular structure, a gas containing phosphorus, fluorine, carbon, and hydrogen in its molecular structure, or a gas containing phosphorus, fluorine, and hydrogen in its molecular structure.

18. The plasma processing method according to claim 17, wherein the hydrogen fluoride species is generated from at least one gas selected from a group consisting of a hydrogen fluoride gas and a hydrofluorocarbon gas.

19. The plasma processing method according to claim 17, wherein the hydrogen fluoride species is generated from a hydrofluorocarbon gas having 2 or more carbon atoms.

20. The plasma processing method according to claim 17, wherein the hydrogen fluoride species is generated from a fluorine containing gas and a hydrogen containing gas.

* * * * *